(12) United States Patent
Perillat (10) Patent No.: US 7,030,471 B2
(45) Date of Patent: Apr. 18, 2006

(54) SEMICONDUCTOR PACKAGE CONTAINING AN INTEGRATED-CIRCUIT CHIP SUPPORTED BY ELECTRICAL CONNECTION LEADS

(75) Inventor: Patrick Perillat, Sassenage (FR)

(73) Assignee: STMicroelectronics S.A., Montrouge (FR)

( * ) Notice: Subject to any disclaimer, the term of this patent is extended or adjusted under 35 U.S.C. 154(b) by 7 days.

(21) Appl. No.: 10/781,557

(22) Filed: Feb. 18, 2004

(65) Prior Publication Data

US 2005/0006732 A1    Jan. 13, 2005

(30) Foreign Application Priority Data

Feb. 18, 2003   (FR)   ................................. 03 01964

(51) Int. Cl.
*H01L 23/495*   (2006.01)
(52) U.S. Cl. ........................... 257/666; 257/692
(58) Field of Classification Search .............. 257/666, 257/685, 686, 692
See application file for complete search history.

(56) References Cited

U.S. PATENT DOCUMENTS

| | | | |
|---|---|---|---|
| 5,471,088 A | 11/1995 | Song | |
| 6,130,115 A | 10/2000 | Okumura et al. | |
| 6,208,020 B1 * | 3/2001 | Minamio et al. | ........... 257/684 |
| 6,396,116 B1 | 5/2002 | Kelly et al. | |
| 6,828,220 B1 * | 12/2004 | Pendse et al. | .............. 438/612 |
| 2002/0093026 A1 | 7/2002 | Huang | |
| 2002/0093078 A1 | 7/2002 | Paek | |

OTHER PUBLICATIONS

Cha Ki-Bon et al. "Ultra-Thin and Crack-Free Bottom Leaded Plastic (BLP) Package Design", Proceedings of the Electronic Components and Technology Conference, Las Vegas, May 21-24, 1995, New York, IEEE, vol. Conf. 45, May 21, 1995, pp. 224-228, XP000624973.
French Preliminary Search Report dated Nov. 18, 2003 for French Application No. 0301964.

\* cited by examiner

*Primary Examiner*—Roy Potter
(74) *Attorney, Agent, or Firm*—Lisa K. Jorgenson; Jon A. Gibbons; Fleit, Kain, Gibbons, Gutman, Bongini & Bianco P.L.

(57) ABSTRACT

Semiconductor package containing an integrated-circuit chip, characterized in that it comprises a leadframe formed from spaced-apart electrical connection leads (5), the integrated-chip being fixed to or supported by a front surface of the leads, electrical connection means (16) for connecting the integrated-chip to the electrical connection leads and a block (20) of an encapsulation material in which at least the electrical connection leads are at least partly embedded.

22 Claims, 6 Drawing Sheets

FIG_1

FIG_4

FIG_2

FIG_3

FIG_5

FIG_6

FIG_7

SEMICONDUCTOR PACKAGE CONTAINING AN INTEGRATED-CIRCUIT CHIP SUPPORTED BY ELECTRICAL CONNECTION LEADS

CROSS-REFERENCE TO RELATED APPLICATIONS

This application is based upon and claims priority from prior French Patent Application No. 03 01964, filed on Feb. 18, 2003 the entire disclosure of which is herein incorporated by reference.

1. Field of the Invention

The present invention generally relates to the field of semiconductor packages and more specifically to a semiconductor package containing an integrated-circuit chip.

2. Background of the Invention

Semiconductor packages that comprise a leadframe that includes a central platform to which an integrated-chip is connected are known. These types of semiconductor packages are generally fabricated with radiating external electrical connection leads connected at a fixed distance from the central platform and generally connected to the integrated-chip via electrical connection wires.

These types of semiconductor packages although useful, have their shortcomings. One shortcoming is the complexity to fabricate the chip. Accordingly, a need exists to overcome the complexity to fabricate semiconductor packages with lead lines attached to integrated circuits.

SUMMARY OF THE INVENTION

The semiconductor package according to the invention containing an integrated-circuit chip, comprises a leadframe formed from spaced-apart electrical connection leads, the chip being fixed to or supported by a front surface of the leads, electrical connection means for connecting the chip to the electrical connection leads and a block of an encapsulation material in which at least the leads are at least partly embedded.

According to the invention, at least some of the leads may advantageously each have at least one rear external electrical connection surface not covered by the encapsulation material of the block.

According to the invention, at least one rear surface of the electrical connection leads and at least one rear surface of the encapsulation block preferably constitute the rear face of the package.

According to the invention, the electrical connection leads preferably have rear recesses covered by the encapsulation material of the block.

According to the invention, at least some of the electrical connection leads may advantageously each have an end part that extends along a rear face of the chip and this chip is fixed to an upper surface of the rear face.

According to a variant of the invention, the chip is fixed to the electrical connection leads via an adhesive film.

According to the invention, the electrical connection means may comprise electrical connection wires that connect the chip to a front surface of the electrical connection leads.

According to the invention, the chip and the electrical connection means may be embedded in the block of encapsulation material.

According to another variant of the invention, the chip is fixed to the electrical connection leads via electrical connection balls.

According to the invention, the encapsulation block may advantageously comprise a peripheral annular part extending forwards.

According to another variant of the invention, the chip is fixed to a rear face of a plate via first electrical connection balls, this plate is fixed to the front face of the leads via second electrical connection balls and the first and second electrical connection balls are connected via electrical connection tracks formed on the rear face of the plate.

According to the invention, the encapsulation block may comprise a peripheral annular part extending forward, around and at a certain distance from the plate. A ring made of a filling material fills the space that separates the periphery of the plate from the peripheral annular part.

According to the invention, the chip may optionally comprise an optical sensor in its front face, the plate being transparent.

According to the invention, the package may optionally support an optical device comprising a lens placed above the plate facing the optical sensor.

According to the invention, the optical device preferably comprises an annular support fixed to the front peripheral part of the package.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

FIGS. 1 to 4 show a semiconductor package 1, having the overall shape of a square-based parallelepiped, having a rear face 2, a front face 3 and side faces 4.

This package 2 includes a flat metal leadframe formed by a multiplicity of spaced-apart radiating electrical connection leads 5 that have a rear surface 6 lying in the plane of the rear face 2.

Each electrical connection lead 5 has an external end part 7 that extends from the corresponding side face 4 and an internal end part 8 that extends beneath the rear face 9 of an integrated-circuit chip 10.

The chip 10 is supported by and fixed to the electrical connection leads 5 via an adhesive film 11 interposed between the rear face 9 of the chip 10 and the front face 12 of the internal end part 8 of the electrical connection leads 5.

The rear end edge of the end part 8 of the electrical connection leads 5 has a rear recess 13 and the rear longitudinal edges of the electrical connection leads 5 have recesses 14 and 15.

The electrical connection leads 5 are electrically connected to the chip 10 via electrical connection wires 16, one end of which is respectively soldered to pads 17 made on the periphery of the front face 18 of the chip 10 and the other end of which is respectively soldered to the front face 19 of the external end part 7 of the leads 5. In the example shown, the front faces 12 and 19 of the electrical connection leads lie in the extension of one another.

The electrical connection leads 5, the chip 10 and the electrical connection wires 16 are embedded in a block 20 of an encapsulation material, for example a thermosetting resin, the perimeter of which corresponds to the aforementioned faces of the package 1.

Thus, the material of the encapsulation block 20 fills the spaces between the electrical connection leads 5 and covers their recesses 13, 14 and 15 in such a way that these electrical connection leads 5 are suitably anchored. The rear face 21 of the encapsulation block 20 lies in the same plane as the rear surfaces 6 of the electrical connection leads 5 in such a way that these rear surfaces 6 are not covered by the encapsulation material and can be externally connected.

The process for fabricating the semiconductor package 1 that has just been described may be the following.

The process starts with a flat metal plate, for example made of copper, which includes a multiplicity of longitudinal and transverse branches that define a multiplicity of locations in which the plate presents a multiplicity of electrical connection leads 5.

At each of the locations, an integrated-circuit chip 10 is fixed to the front face of the internal parts 8 of the corresponding electrical connection leads 5, having beforehand provided the chips 10 with an adhesive film 9.

The process continues with the electrical connection wires 16 being placed in each of the locations.

The plate thus equipped is placed in the cavity of an injection-moulding mould in a position such that the rear surfaces 6 of the electrical connection leads 5 are in contact with a wall of this cavity and the encapsulation material is injected in order to form the block 20.

Finally, after demoulding, the component obtained is cut up by sawing so as to obtain semiconductor packages 1 at each aforementioned location.

Figures 1, 4:
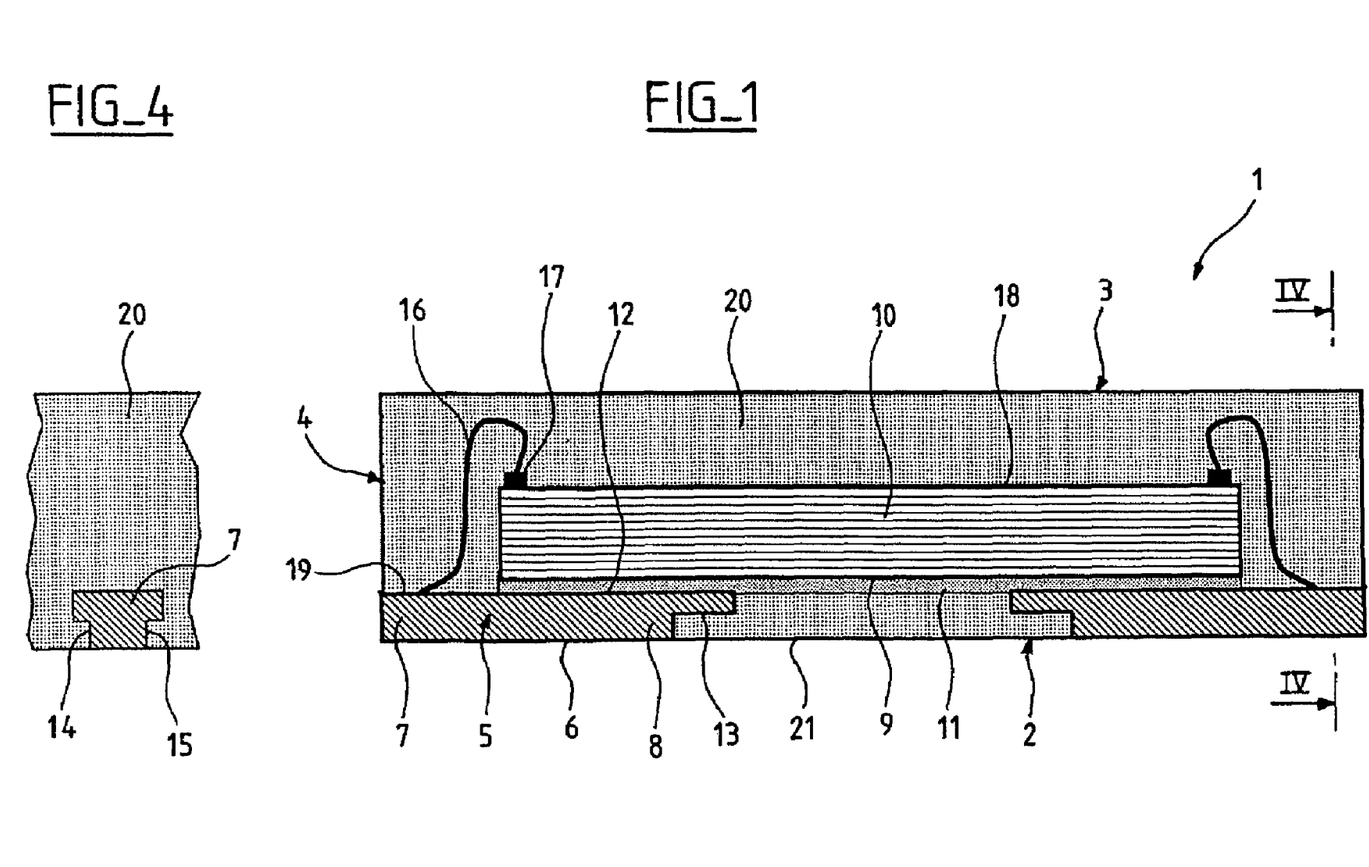
FIG. 1 shows a cross section of a semiconductor package according to the present invention.
FIG. 4 shows a partial section on IV—IV of the semiconductor package of FIG. 1.
Figure 2:
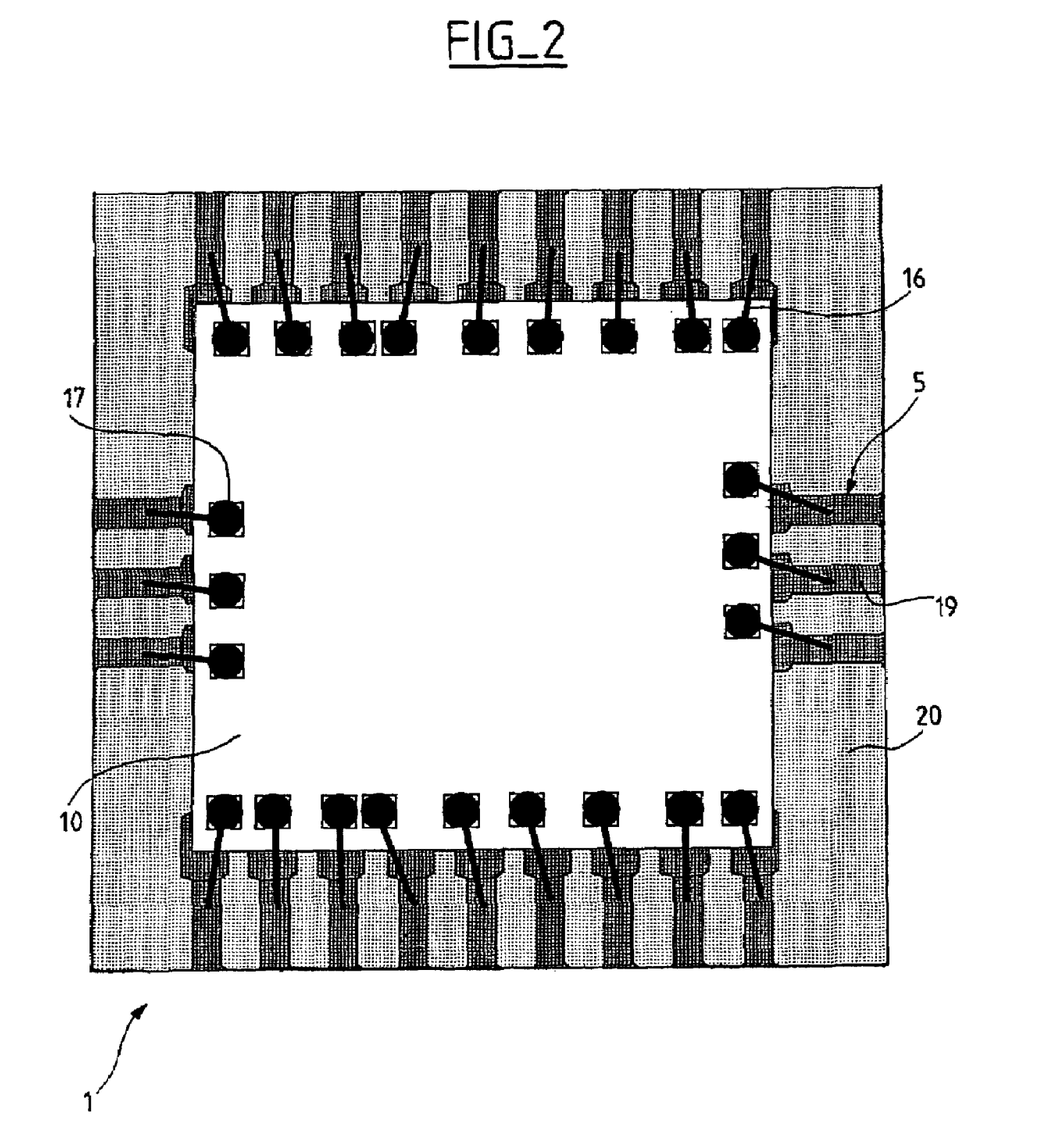
FIG. 2 shows a partially cut-away top view of the semiconductor package of FIG. 1.
Figure 3:
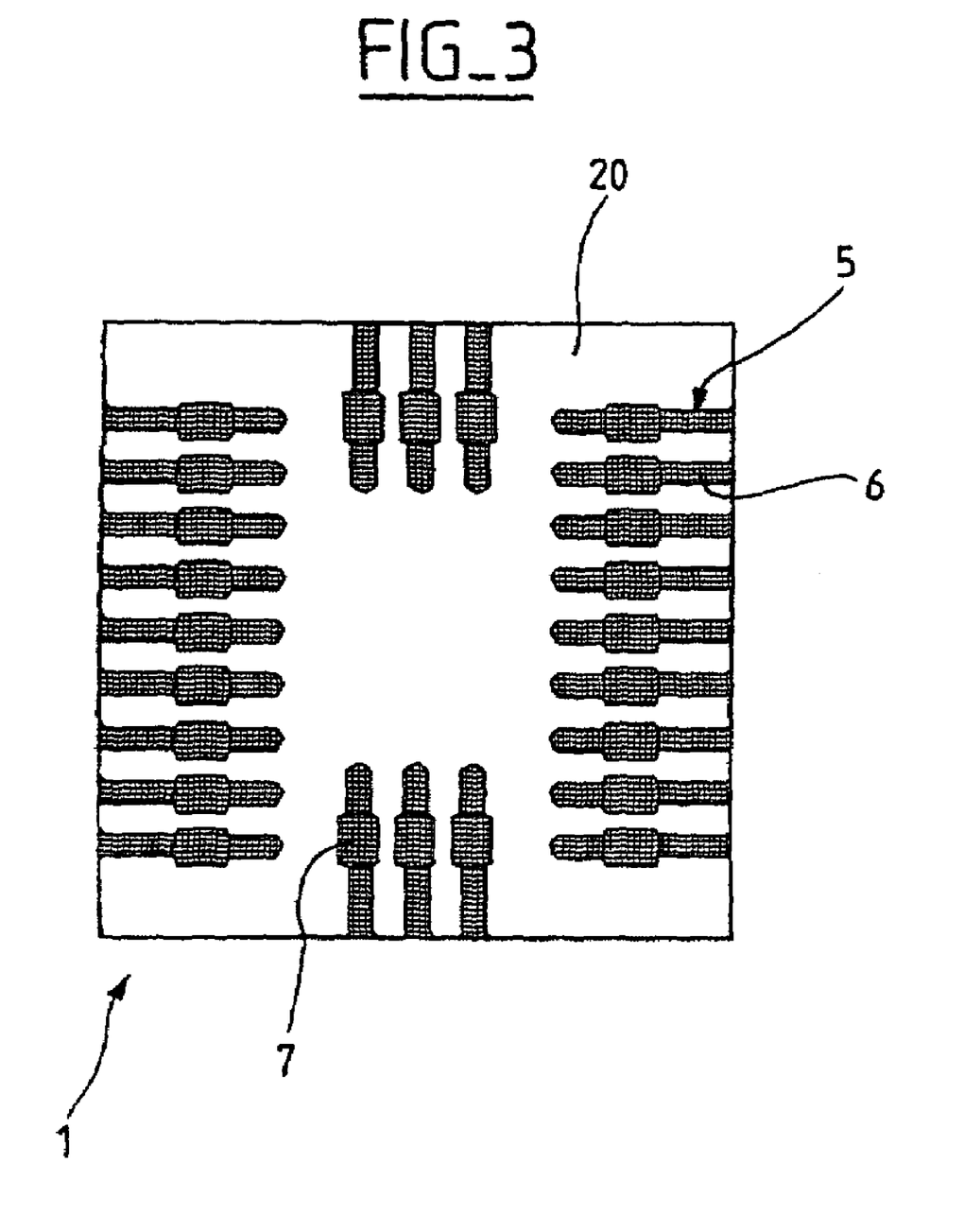
FIG. 3 shows a bottom view of the semiconductor package of FIG. 1.
Figure 5:
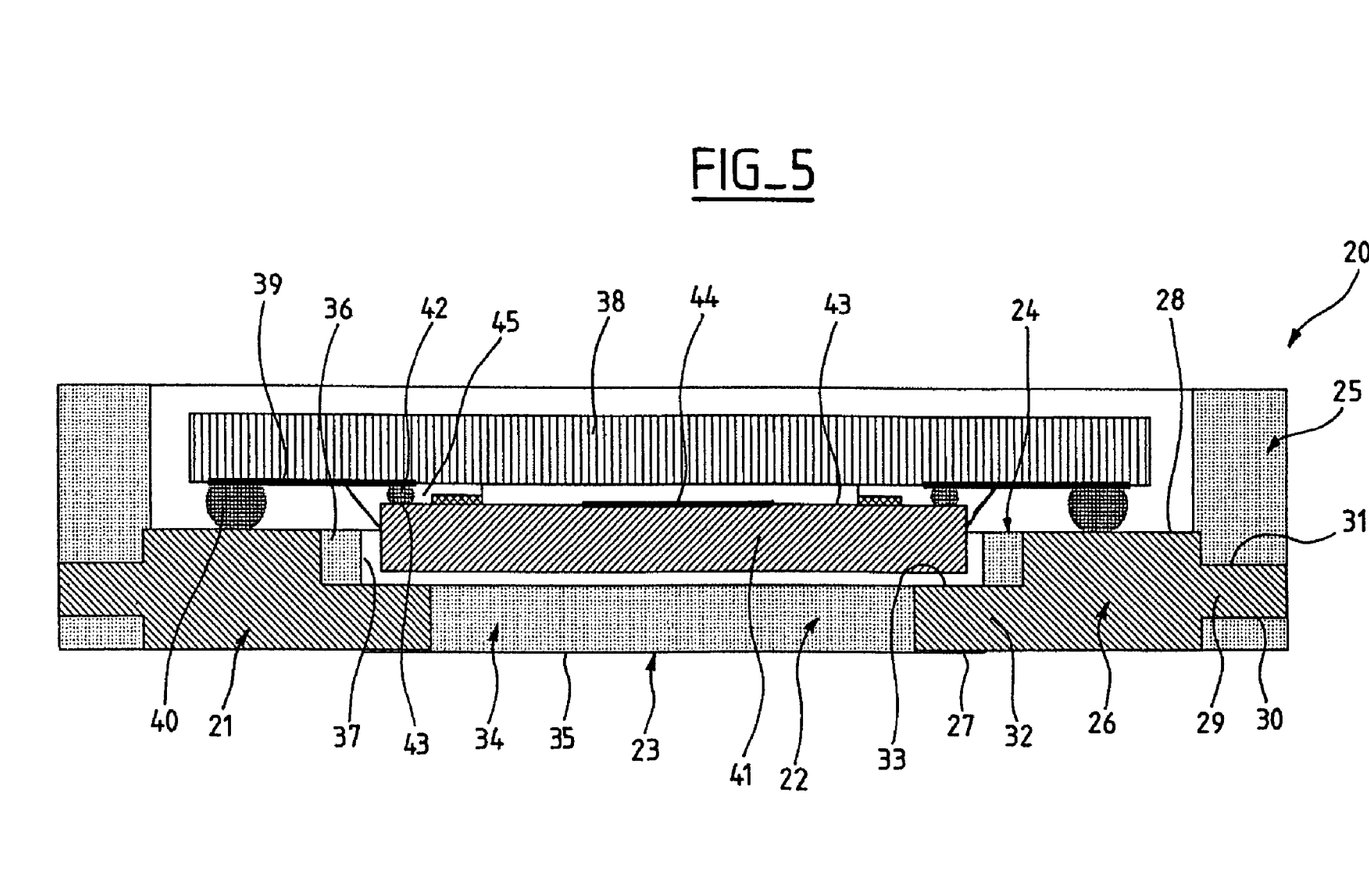
FIG. 5 shows a cross section of another semiconductor package according to the present invention.
Figure 6:
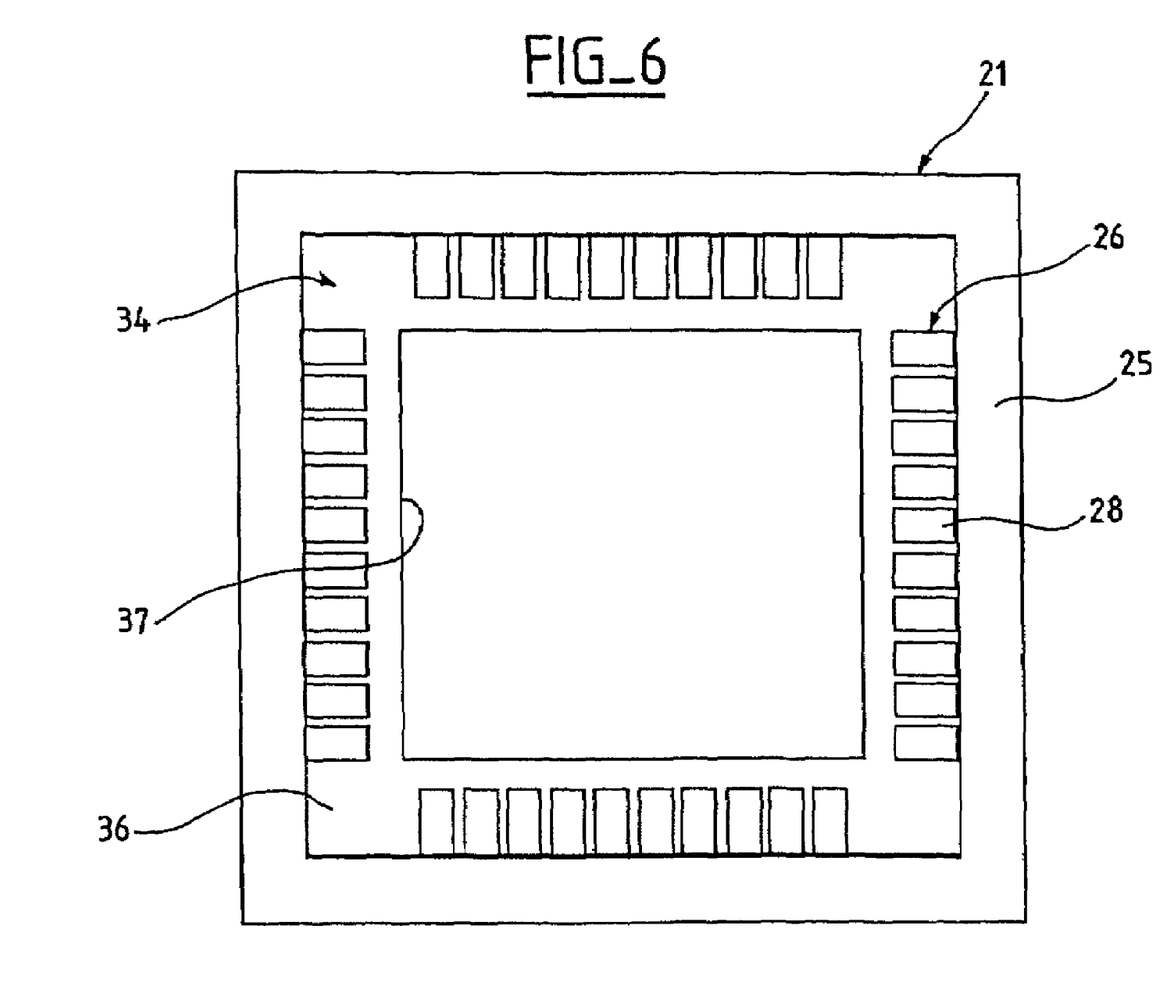
FIG. 6 shows a top view of the body of the semiconductor package of FIG. 5.

FIGS. 5 and 6 show a semiconductor package 20 that comprises a square-based package body 21 produced in the following manner.

This package body 21 comprises a rear wall 22, which has a rear face 23 and a front face 24, and a forward projecting peripheral wall 25 forming an annular wall.

The rear wall 22 comprises a flat metal leadframe formed from a multiplicity of radiating electrical connection leads 26 that have, respectively, a rear surface 27 lying in the plane of the rear face 23 and a front surface 28 that lies in the plane of the front face 24.

In the rear edge and in the front edge of their external end part 29 going right up to the lateral face of the body 21, the electrical connection leads 26 have recesses 30 and 31.

In their internal end part 32, the electrical connection leads 26 have, in their upper edge, recesses 33.

The electrical connection leads 26 also have, in their rear longitudinal edges, recesses (not shown in the drawing) that are equivalent to the recesses 14 and 15 of the previous example.

The package body 2 furthermore includes a block 34 of an encapsulating material, for example a thermosetting resin, that fills the spaces between the electrical connection leads 26 and the aforementioned recesses of the latter, and has a rear face 35 lying in the plane of the rear face 23 and a front face 36 lying in the plane of the front face 24.

Thus, the rear surfaces 27 and the front surfaces 28, opposite one another, of the electrical connection leads 26 are not covered by the encapsulation material, the block 34 having a central front recess 37, the bottom of which extends as far as the bottom of the front inner recesses 33 of the electrical connection leads 26.

To fabricate the package body 21 that has just been described, it may be advantageous to use a plate that has longitudinal and transverse branches between which locations are formed in each of which the plate has electrical connection leads 26.

This plate is placed in the cavity of an injection-moulding mould having opposed walls that bear on the rear surface 27 and front surface 28 of the electrical connection leads 26.

An encapsulation material is then injected in order to form the block 34.

After this, the component obtained is cut up by sawing so as to obtain a package body 21 at each location.

Having done this, the semiconductor package 20 includes a transparent plate 38 placed flat in the package body 21, its periphery being at a certain distance from the peripheral wall 25.

The plate 38 has, on its rear face, electrical connection tracks 39 and is fixed to and supported by the electrical connection leads 26 by means of electrical connection balls 40 that are interposed and soldered, on the one hand, to the electrical connection tracks 39 and, on the other hand, to the front surface 28 of the electrical connection leads 26.

The semiconductor package 20 furthermore includes an integrated-circuit chip 41 placed in the rear of the plate 38 and freely engaged in the recess 37 of the package body 21. The chip 41 is fixed to and supported by the plate via electrical connection balls 42 that are soldered, on the one hand, to the tracks 39 of the plate 38, and, on the other hand, to electrical connection pads 43 provided around the periphery of the front face 43 of the chip 41.

Furthermore, the front face 43 of the chip 41 has, in its central part, an optical sensor 44 and the space between the periphery of the chip 41 and the rear face of the plate 38 is filled with a filling material 45 in which the balls 42 are embedded.

It follows from the foregoing that the chip 41 is supported by the electrical connection leads 21 via the balls 42 and the filling material 45, the plate 38 and the balls 40, the optical sensor being in a closed space and therefore protected.

The assembly formed by the transparent plate 38 and the chip 41 is produced separately from the available package body 21, as described above, by fixing the chip 41 to the plate 32 as described above. This assembly is then installed in the package body 21, fixing it by means of electrical connection balls 40 as described above.

Figure 7:
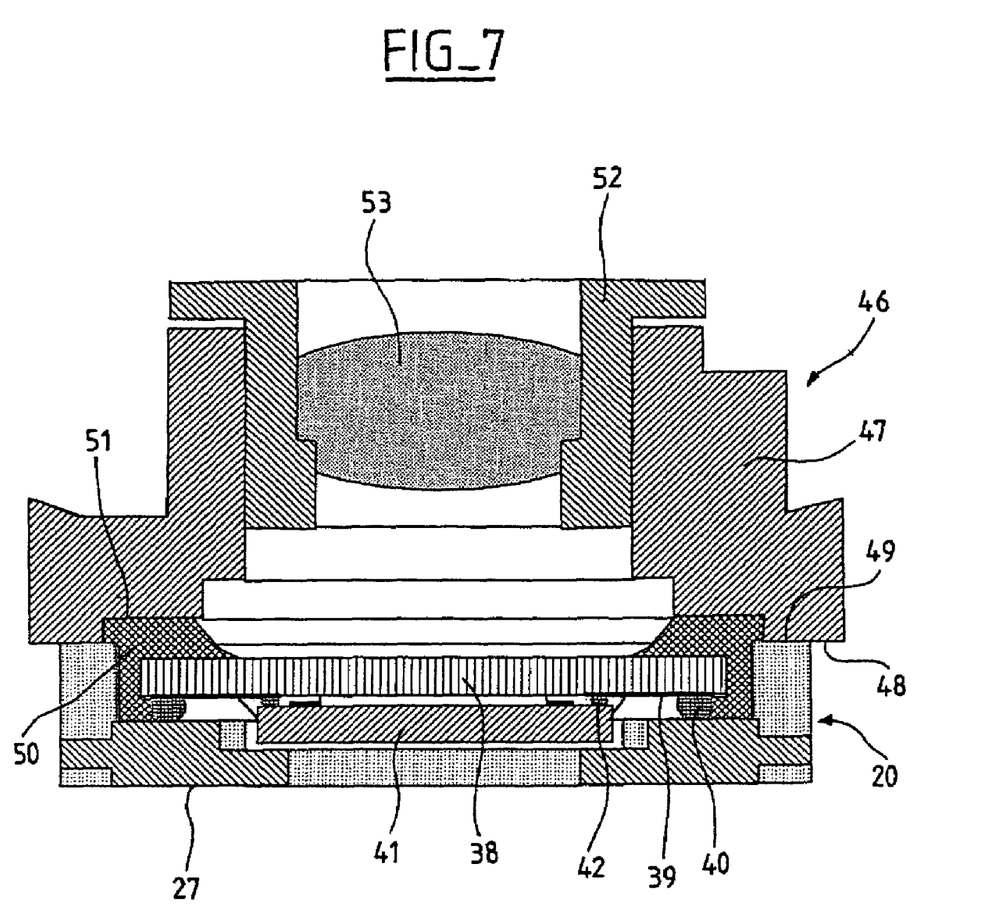
FIG. 7 shows a cross section of the semiconductor package of FIG. 5 equipped with an optical device.

FIG. 7 shows that the semiconductor package 20 is equipped at the front with an optical device 46 that includes an annular body 47, the rear face 48 of which bears on the front face 49 of the peripheral wall 25 of the package body 21. This annular body 47 is fixed to the front peripheral part of the semiconductor package 20 by means of a ring 50 of adhesive filling material that fills the space between the plate 38 and the peripheral wall 25 of the body of the package 21 and a rear annular recess 51 of the support 47 adjacent to its rear face 48.

The optical device 46 furthermore includes an adjustment ring 52 screwed into the annular support 47, this annular ring 52 carrying, in its bore, an optical lens 53 which is thus placed so as to face the optical sensor 44 of the chip 41.

It follows from the foregoing that the chip 41 is placed in a sealed space bounded by the package body 21, the plate 38 and the filling ring 50.

As a variant, it would be possible for the package 20 to be provided only with the adhesive filling ring 50, and to be used directly without being equipped with the optical device 46.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor package containing an integrated-circuit chip, the semiconductor package comprising:
   a leadframe formed from spaced apart electrical connection leads, each electrical connection lead having a rear face;
   an integrated-chip fixed to a front surface of the electrical connection leads;
   electrical connection means for connecting the integrated-chip to the electrical connection leads; and
   a block of an encapsulation material into which at least a portion of the electrical connection leads are embedded, the block having a rear face, wherein the rear face of the electrical connection leads and the rear face of the block form a rear face of the semiconductor package, and wherein the electrical connection leads have rear recesses covered by the encapsulation material.

2. The semiconductor package according to claim 1, wherein one or more of the electrical connection leads have at least one rear external electrical connection surface that is not covered by the encapsulation material.

3. The semiconductor package according to claim 2, wherein one or more of the electrical connection leads have at least one rear external electrical connection surface which is not covered by the encapsulation material so as to form a rear face of a semiconductor package.

4. A semiconductor package containing an integrated-circuit chip, the semiconductor package comprising:
   a leadframe formed from spaced apart electrical connection leads;
   an integrated-chip fixed to a front surface of the electrical connection leads;
   electrical connection means for connecting the integrated-chip to the electrical connection leads; and
   a block of an encapsulation material into which at least a portion of each of the electrical connection leads is embedded, wherein the electrical connection leads have one or more rear recesses covered by the encapsulation material.

5. The semiconductor package according to claim 1, wherein one or more of the electrical connection leads have an end part that extends along a rear face of the integrated-chip and wherein the integrated-chip is fixed to an upper surface of the rear face.

6. The semiconductor package according to claim 5, wherein the integrated-chip is fixed to the electrical connection leads via an adhesive film.

7. The semiconductor package according to claim 1, wherein the electrical connection means further comprises one or more electrical connection wires that electrically connect the integrated-chip to the front surface of the electrical connection leads.

8. The semiconductor package according to claim 1, wherein the integrated-chip and the electrical connection means are embedded in the block of the encapsulation material.

9. The semiconductor package according to claim 1, wherein the integrated-chip is fixed to the electrical connection leads via one or more electrical connection balls.

10. A semiconductor package containing an integrated-circuit chip, the semiconductor package comprising:
    a leadframe formed from spaced apart electrical connection leads;
    an integrated-chip fixed to a front surface of the electrical connection leads;
    electrical connection means for connecting the integrated-chip to the electrical connection leads; and
    an encapsulation block into which at least a portion of each of the electrical connection leads are embedded, wherein the encapsulation block further comprises a forward projecting peripheral wall forming an annular wall.

11. The semiconductor package according to claim 1,
    wherein the integrated-chip is fixed to a rear face of a plate via first electrical connection balls,
    wherein the plate is fixed to a front face of the electrical connection leads via second electrical connection balls, and
    wherein the first electrical connection balls and the second electrical connection balls are connected via electrical connection tracks formed on the rear face of the plate.

12. A semiconductor package containing an integrated-circuit chip, the semiconductor package comprising:
    a leadframe formed from spaced apart electrical connection leads;
    an integrated-chip fixed to a front surface of the electrical connection leads;
    electrical connection means for connecting the integrated-chip to the electrical connection leads; and
    an encapsulation block into which at least a portion of each of the electrical connection leads is embedded, wherein the encapsulation block further comprises:
      a forward projecting peripheral wall forming an annular wall that extends a distance from the plate, and
      a ring of a filling material that fills a space that separates a periphery of the plate from the annular wall.

13. The semiconductor package according to claim 12, wherein the integrated-chip further comprises an optical sensor on a front face of the integrated-chip and wherein the plate is transparent.

14. The semiconductor package according to claim 13, further comprising:

an optical device comprising a lens placed above the plate facing the optical sensor.

15. The semiconductor package according to claim 14, wherein the optical device further comprises an annular support fixed to the annular wall.

16. The semiconductor package according to claim 15, wherein the annular support is adhesively bonded to the annular wall via the ring of filling material.

17. A semiconductor package containing an integrated-circuit chip, the semiconductor package comprising:
- a leadframe formed from spaced apart electrical connection leads;
- an integrated-chip fixed to a front surface of the electrical connection leads;
- electrical connection means for connecting the integrated-chip to the electrical connection leads;
- a block of an encapsulation material into which at least a portion of each of the electrical connection leads is embedded;
- a wall formed by the electrical connection leads and at least partly the block of encapsulation material; and
- one or more front electrical connection surfaces for connecting the integrated-chip, wherein the front electrical connection surfaces are not covered by the encapsulation material;
- wherein the encapsulation material fills one or more spaces formed between:
  - the electrical connection leads with rear external electrical connection leads surfaces not covered by the encapsulation material, and
  - the electrical connection leads with rear external electrical connection leads surfaces covered by the encapsulation material.

18. The semiconductor package according to claim 1, in which the integrated-chip and the electrical connection means are embedded in the block of the encapsulation material.

19. The semiconductor package according to claim 18, in which the block of the encapsulation material further comprises:
- a forward-projection peripheral wall forming an annular wall surrounding the integrated-chip at a distance, and
- means, carried by the forward-projection peripheral wall, covering the integrated-chip at a distance.

20. A semiconductor package containing an integrated-circuit chip, the semiconductor package comprising:
- a leadframe formed from spaced apart electrical connection leads, each electrical connection lead having a front face, an internal end part and an external end part;
- an integrated-chip fixed to a front surface of the electrical connection leads, the integrated-chip having a rear face fixed, via adhesive film, onto the front face of the internal end part of each electrical connection lead;
- electrical connection wires connect front pads of the integrated-chip to the front faces of the external end parts of the electrical connection leads; and
- a block of an encapsulation material into which at least a portion of the electrical connection leads is embedded.

21. A semiconductor package of claim 20, in which the integrated-chip and the electrical connection wires are embedded in the block of the encapsulation material.

22. A semiconductor package of claim 21, in which the block of the encapsulation material further comprises:
- a forward-projection peripheral wall forming an annular wall surrounding the integrated-chip at a distance, and
- means, carried by the forward-projection peripheral wall, covering the integrated-chip at a distance.

* * * * *